United States Patent [19]

Feldman

[11] Patent Number: 4,493,945
[45] Date of Patent: Jan. 15, 1985

[54] THERMAL PROTECTIVE SYSTEM

[75] Inventor: Rubin Feldman, St. Louis County, Mo.

[73] Assignee: Thermal Science, Inc., St. Louis, Mo.

[21] Appl. No.: 410,454

[22] Filed: Aug. 23, 1982

[51] Int. Cl.³ .......................... H02G 3/04; B32B 3/30
[52] U.S. Cl. .................................. 174/68 C; 428/213; 428/220; 428/182; 428/920; 428/921; 428/255
[58] Field of Search ............... 428/184, 920, 921, 213, 428/182, 220, 255; 174/68 C, 107, 121 A

[56] References Cited

U.S. PATENT DOCUMENTS

| | | |
|---|---|---|
| 2,680,077 | 12/1949 | Nielsen . |
| 3,022,190 | 2/1962 | Feldman . |
| 3,284,216 | 11/1965 | Kaplan . |
| 3,849,178 | 11/1974 | Feldman . |
| 3,913,290 | 10/1975 | Billing . |
| 3,915,777 | 10/1975 | Kaplan . |
| 4,018,962 | 4/1977 | Pedlow . |
| 4,062,160 | 12/1977 | Christison ............................ 52/445 |
| 4,064,359 | 12/1977 | Peterson . |
| 4,069,075 | 1/1978 | Billing . |
| 4,089,324 | 5/1978 | Tjaden ............................ 428/184 X |
| 4,204,016 | 5/1980 | Chavannes ...................... 428/184 X |
| 4,276,332 | 6/1981 | Castle . |
| 4,292,358 | 9/1981 | Fryer . |

Primary Examiner—Alexander S. Thomas
Attorney, Agent, or Firm—Polster, Polster and Lucchesi

[57] ABSTRACT

An envelope system for protecting a substrate from fire or other thermal extreme. The system includes a screen, which surrounds the entire substrate and which is set off from the substrate by ridges folded into the screen, and a thermal protective coating applied to the screen and spaced from the substrate by the screen to form an air gap between the substrate and the coating.

20 Claims, 12 Drawing Figures

THERMAL PROTECTIVE SYSTEM

BACKGROUND OF THE INVENTION

This invention relates to thermal protective systems, structures and methods for protecting underlying substrates such as structural beams and columns, tanks, electrical cables and cable trays, junction boxes and other containers, and various other substrates which may be subjected to thermal extremes and flame.

Numerous thermal protective coating materials and systems for applying them are known. Some of the materials are foamed passive insulative materials which protect merely by their low thermal conductivity and their thickness as applied. These include foamed cement or intumesced silicates. Other materials provide active thermal protection. Some intumesce when heated to form a thick closed cell protective layer over the substrate. These include silicate solutions or ammonium phosphate paints or materials such as those disclosed in Nielsen et al., U.S. Pat. No. 2,680,077 or Kaplan, U.S. Pat. No. 3,284,216. Other active thermal protective materials include constituents which sublime at a predetermined temperature, such as those disclosed in Feldman, U.S. Pat. No. 3,022,190. The active thermal protective materials disclosed in Feldman, U.S. Pat. No. 3,849,178 are particularly effective; when subjected to thermal extremes, these materials both undergo an endothermic phase change and expand to form a continuous porosity matrix.

Various methods and structures have also been used or proposed for applying these thermal protective coating materials. The most frequent approach is to apply the materials directly to the substrate, without additional structure. For many applications, however, a reinforcing material, such as fiberglass sheet or a wire mesh, has been embedded in the coating material to strengthen the material and prevent it from cracking or falling off the substrate under conditions of flame or thermal extreme. Examples of this approach are found in Feldman, U.S. Pat. No. 3,022,190, Billing et al, U.S. Pat. No. 3,913,290, Kaplan, U.S. Pat. No. 3,915,777, and Billing et al, U.S. Pat. No. 4,069,075. Sometimes the materials are first applied to a reinforcing structure such as a flexible tape or flexible wire mesh, and the combined structure is applied to the substrate. Examples of this approach are found in Feldman, U.S. Pat. No. 3,022,190, Pedlow, U.S. Pat. No. 4,018,962, Peterson et al, U.S. Pat. No. 4,064,359, Castle, U.S. Pat. No. 4,276,332, and Fryer et al, U.S. Pat. No. 4,292,358. In these last-mentioned systems, the purpose of the reinforcing structure may be both to strengthen the resulting composite and to permit its application to a substrate without directly spraying, troweling or painting the uncured coating materials onto the substrate. In any of the foregoing methods and structures, multiple layers are frequently applied to the substrate to provide additional protection.

All of the presently known materials, structures and methods suffer from certain defects. For example, they provide less protection than desirable from prolonged and extreme thermal conditions. Even the active compositions add substantial weight to the substrate. Many of the more effective systems are difficult and expensive to install. They are also subject to loss of effectiveness or failure after being applied, for example if they are subjected to severe vibration.

SUMMARY OF THE INVENTION

One of the objects of this invention is to provide an improved thermal protective system and method for protecting substrates such as structural beams and columns, tanks, electrical cables and cable trays, junction boxes and other containers, and various other substrates which may be subjected to thermal extremes and flame.

Another object is to provide such a thermal protective system and method which are more effective than those previously known, and which are light weight and provide easy application over a variety of substrates.

Another object is to provide such a thermal protective system and method which provide a high degree of resistance to vibration, mechanical shock, differential thermal expansion and thermal stress.

Other objects will occur to those skilled in the art in light of the following description and accompanying drawings.

In accordance with one aspect of this invention, generally stated, a thermal protective structure is provided for application over a substrate, the thermal protective structure comprising a mesh support structure having a plurality of spacers formed integrally therein and an active thermal protective composition applied to the support structure, the active thermal protective composition being held, through the major part of its extent, spaced from the substrate by the spacers and responding to thermal extremes to protect the substrate. The term "mesh" is used broadly herein to include any perforate material.

In the preferred embodiments, the mesh is a conformable, self-stiffened, self-supporting metal mesh having formed therein V-shaped stiffening ridges which also function as the integral spacers. Preferably, the V-shaped stiffening ridges have a height of about 0.1 to 1.0 inches, and a base of about 0.1 to about 1.0 inches and are spaced apart about two to eighteen inches. In the presently preferred embodiments, the height is about 0.35 +/− 0.15 inches, to provide excellent insulation by the dead air space between the mesh and the substrate, while reducing transfer of heat by convection. Also in the preferred embodiments, the mesh is a woven steel screen having on the order of four to twelve openings per linear inch.

Numerous active thermal protective materials are suitable for use in the system of the invention. The most effective materials, and therefore the preferred materials, are ones which when subjected to thermal extremes partially undergo an endothermic phase change from a solid to a gas and expand somewhat to form a continuous porosity (open cell) matrix. Suitable materials of this type are disclosed in Feldman, U.S. Pat. No. 3,849,178. Many of the advantages of the present invention, however, may be realized with the use of other active thermal protective materials, such as the subliming materials or intumescent materials previously mentioned. The thickness of the active thermal protective material is determined by the material utilized, the intensity and nature of the anticipated thermal extreme, and the length of protection desired.

In the process of the invention, the active thermal protective material is applied to one side of the mesh, leaving the other side of the mesh at least partially exposed. The mesh is placed over the substrate with at least a part of its integral spacer in contact with the substrate, to space the assembly from the substrate.

The active thermal protective material may be applied to the mesh either before or after the mesh is applied to the substrate. In most applications, the mesh is applied completely around the substrate in one or more pieces, and the piece or pieces of mesh are secured to one another by fasteners such as screws, staples, or tie wires, or by adhesives.

When the mesh is applied to the substrate before the active thermal protective material is applied to it, the fasteners are covered with the active thermal protective material as the material is applied.

When the active thermal protective material is applied first and the assembly is attached as an envelope around the substrate, margins of the mesh are left uncoated, to provide easy joinder of the mesh to itself when the envelope system is attached. After the envelope system is attached, the margin is preferably coated with the active thermal protective material. For application around a substrate with edges, the active thermal protective material is scored and the screen is bent along the score line. The open edge of the active thermal protective material is then filled with a bead of the material, to provide a continuous protective coat of generally equal depth completely around the substrate.

DESCRIPTION OF THE PREFERRED EMBODIMENTS

Figure 1:
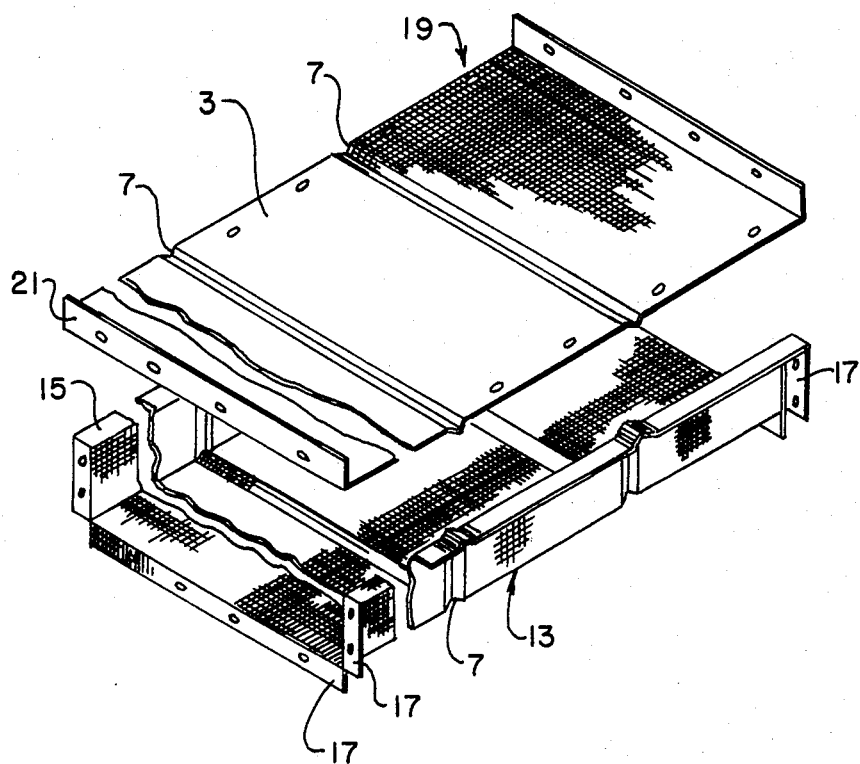
FIG. 1 is a view in perspective of a mesh support structure for use in the present invention.
Figure 2:
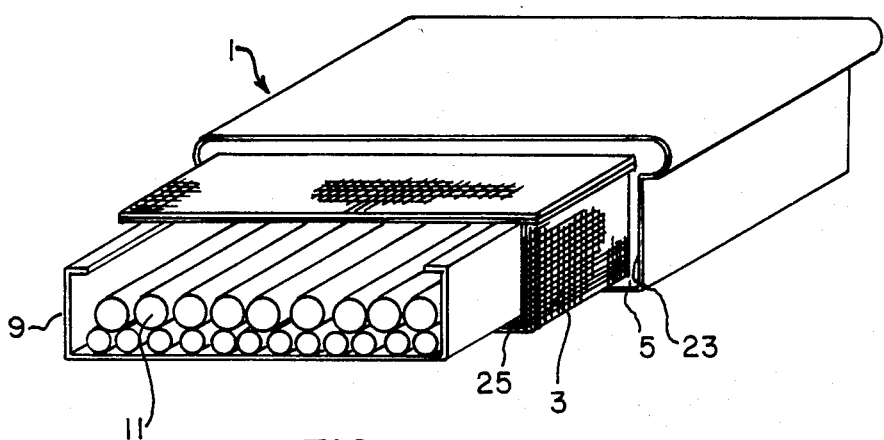
FIG. 2 is a view in perspective, partially broken away, of a cable tray protected by a thermal protective envelope system of the present invention, incorporating the mesh support structure of FIG. 1.
Figure 3:
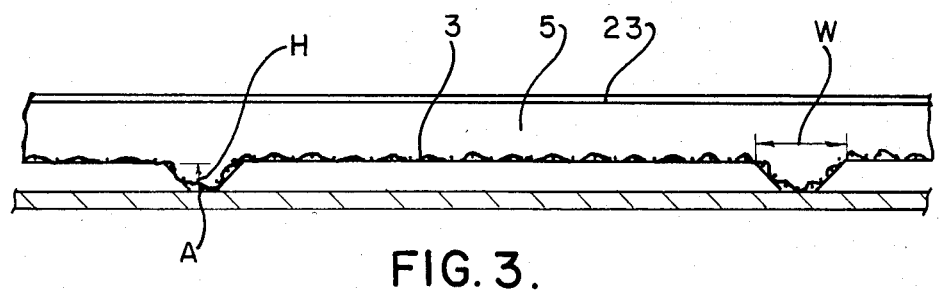
FIG. 3 is a cross-sectional detail of the cable tray and protective system of FIG. 2.

Referring now to the drawings, and in particular to FIGS. 1-3, reference numeral 1 indicates an illustrative thermal protective envelope system of the present invention. The thermal protective system 1 includes a mesh screen 3 having an active thermal protective material 5 applied to its outside surface. Inwardly extending ridges 7 are formed in the screen 3. The envelope system 1 surrounds a cable tray 9 carrying a plurality of electrical cables 11 and protects the tray and cables from fire and thermal extremes.

The screen 3 is illustratively a woven galvanized steel screen having a mesh size of sixty-four openings per square inch and is formed of 0.019 inch diameter wire strands. The screen has a weight of about 1.75 pounds per square yard. For ease of handling, the screen 3 is transported in rolls and applied in lengths of no greater than ten feet.

The ridges 7 extend crosswise of the length of the screen 3, from edge to edge of the screen 3, and serve both to stiffen the screen 3 and to hold the screen 3 away from the tray 9 as hereinafter described. In this illustrative embodiment, the ridges 7 are V-shaped, with the apex A of the "V" extending toward the substrate to be protected. The height H of the "V" is about 0.3 inches, and the width W of the base of the "V" (in the plane of the screen 3) is about 0.5 inches. The ridges 7 are spaced about six inches from each other.

From the roll of screen 3 is cut a piece of material large enough to form a bottom section 13 of a "clam shell" envelope. The width of the bottom section 13 is equal to the sum of the width of the cable tray 9 plus twice its height, plus 3.5 inches. If required, several ten-foot long sections 13 may be cut to this width.

From each corner of each section 13 is cut a 1.25 inch square. The section 13 is bent into a "U" by making two ninety degree bends parallel to the long edges of the section and spaced from each other a distance equal to the width of the cable tray plus one-half inch. Outwardly extending 1.25 inch side flanges 15 and outwardly extending 1.25 inch end flanges 17 are formed around the periphery of the bottom section 13 by bending the screen ninety degrees along lines joining the inner corners of the 1.25 inch squares previously cut in the corners of the section. It will be noted that the ends of the folds which were previously made to form the "U" must be slit to permit the end flanges 17 to be formed.

The top section 19 of screen 3 is cut to the required length and to a width equal to the width of the cable tray plus 2.5 inches. At each end of the top section 19, 1.25 inch end flanges 21 are formed by making ninety degree bends in the screen.

If required, holes are drilled for fastening the bottom and top sections of the screen together and for attaching successive sections of the screen envelope to each other.

The bottom and top sections of the screen envelope are mounted around the cable tray and fastened to each other at about six to eighteen inch intervals using mechanical fasteners, staples or 18-gauge galvanized tie wire. Additional sections of the envelope are attached around the cable tray and are attached end-to-end by fastening their end flanges using mechanical fasteners, staples or 18-gauge galvanized tie wire.

The illustrative thermal protective material 5 is a material commercially available from TSI Inc., of St. Louis, Mo. under the trademark Thermo-Lag 330-1 Subliming Coating. Thermo-Lag 330-1 Subliming Coating is a water-based, thermally activated material which partially volatilizes at a fixed temperature to form a continuous porosity matrix which absorbs and blocks heat to protect the substrate material in accordance with my aforesaid U.S. Pat. No. 3,849,178.

The active thermal protective material 5 may be applied to the screen 3 either before or after the screen is attached to the cable tray 9. For spray application, the material 5 is applied in as many passes as required to provide the required coating thickness in accordance with industry standards, avoiding slumping or sagging of the coating. For example, a required 0.50 inch dry coating thickness of Thermo-Lag 330-1 may normally be accomplished by applying three wet coats of 0.225 inches. If fiberglass armoring is used, the fiberglass cloth 23 is applied to the wet surface after the final coat and is embedded in the material with a roller before a light coating of material 5 is applied to cover the fiberglass. The material 5 may also be applied by hand troweling material to a uniform thickness, using moderate pressure and gloving the material as necessary.

The material 5 extends into the openings of the screen sufficiently to lock it to the screen, but leaves the screen partially exposed. Therefore, the screen 3 acts as a base for the material 5 but is not encapsulated in it. The apexes of the V-shaped ridges 7 in the screen act to space the assembly from the substrate regardless of whether the material is applied before or after the screen is applied to the cable tray 9.

It will be seen that the envelope system 1 is applied simply and without the need for accessory items like frameworks or separate spacers. The screen 3 provides great stability of the system, both day-to-day and under conditions of fire or other thermal extremes. The air gap 25 between the screen 3 and the cable tray 9 is believed to provide substantial increases in the resistance of the system to fire.

The system 1 applied to a cable tray as described was tested in accordance with ASTM-E-119-76 (ANSI A2.1) in a one-hour fire test. Immediately following the fire test, the system was further tested by applying a stream of water from a one-and-a-half inch fire hose at a rate of about ninety-five gallons per minute at a nozzle pressure setting of ninety psig and a discharge angle of 15°, at a distance of ten feet for a period of two-and-one-half minutes. During both the flame test and the water stream test, the continuity of selected electrical cables in the cable tray was tested continuously. After both tests, it was determined that electrical continuity remained unimpaired and that the surface temperature of the cables within the cable tray did not exceed 315° F., well below the commonly accepted maximum of 400° for such cables.

Figure 4:
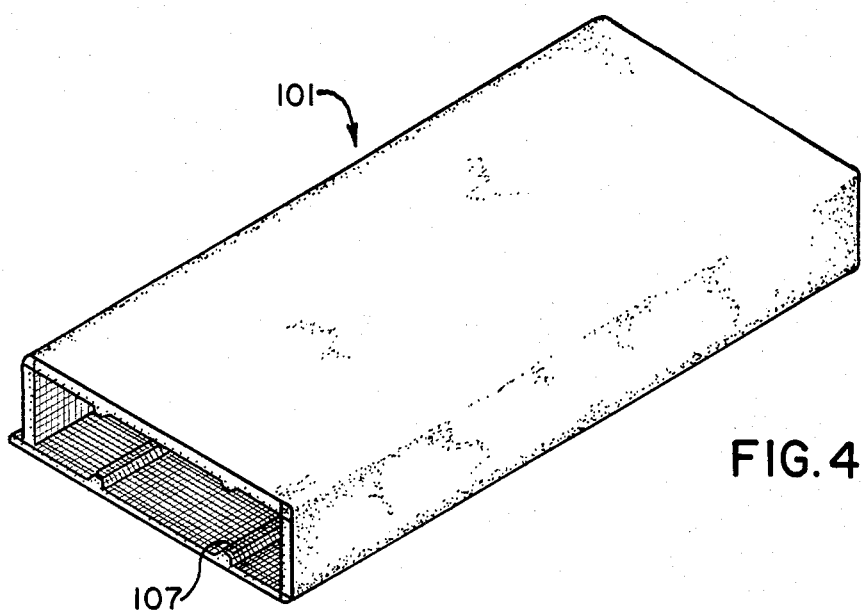
FIG. 4 is a view in perspective of another embodiment of a thermal protective envelope system of the present invention.
Figure 5:
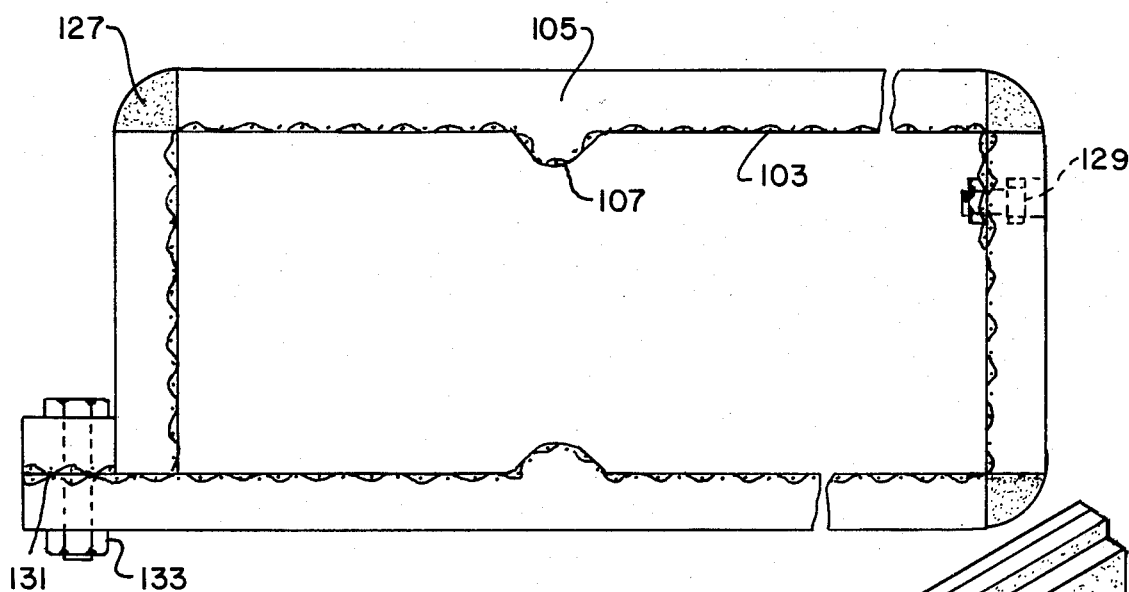
FIG. 5 is a view in end elevation of the thermal protective envelope system of FIG. 4.

Referring now to FIGS. 4 and 5, an alternative embodiment 101 of the present invention differs from the embodiment previously described in a number of respects. Each of these changes is independent of the others, and merely represents an illustrative variation in the system of the invention. Corresponding reference numerals are used to indicate corresponding parts. In this illustrative embodiment, the active thermal protective material 105 is applied to flat sheets of screen 103 in the same manner as previously described. The active thermal protective composition is made in accordance with Example 11 of my aforesaid U.S. Pat. No. 3,849,178. After the material 105 is applied, the composite is cut to size, with the ridges 107 running lengthwise. Bends in the screen are made by slitting the dried composition along the bend lines, bending the screen, and filling the edges with a bead 127 of the composition 105. The complete envelope is formed from two sheets of screen 103 by adhering two uncoated margins of each sheet of screen along one line of joinder as indicated at 129, and by bending out an uncoated margin on the opposite edges of each screen as shown at 131 and bolting them together as shown at 133. Preferably, the bolts are covered with material 105 after the halves of the envelope 101 are connected around a substrate. It should be noted that it is preferred to have the ridges run transversely of the length of the system 301, rather than lengthwise as in this embodiment. The slitting, bending, and filling steps may be the same in either case.

Figure 6:
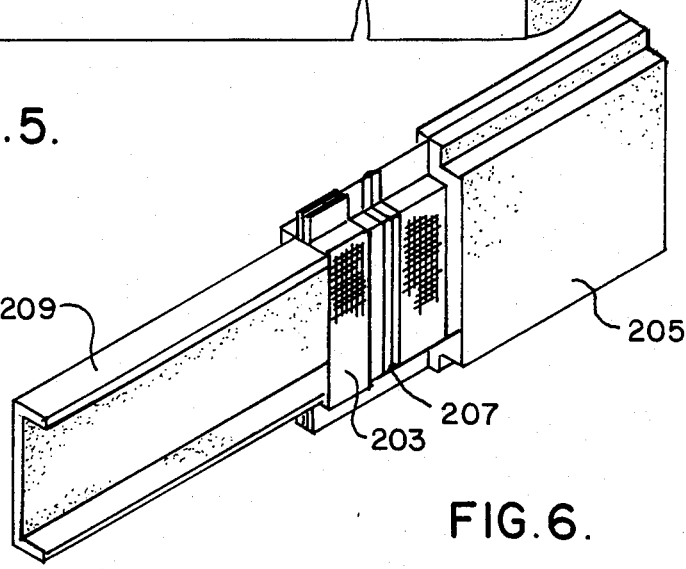
FIG. 6 is a view in perspective, partially broken away, of another embodiment of a thermal protective envelope system of the present invention.

As shown in FIG. 6, the clam shell construction of FIG. 1 may be modified by forming the mesh 205 as two identical halves, rather than as a top and a bottom. As also shown in this embodiment, successive lengths of the mesh 205 may be joined by overlapping sections of screen and joining them with connectors, staples or ties. In this embodiment, the active thermal protective material is an intumescent coating sold by Avco Corporation under the name "Chartek 59". Although this material is not preferred, its application in accordance with the present invention does provide advantages as compared with applying the material directly to the substrate. It will be noted that in contradistinction to the arrangement described in Billing, U.S. Pat. No. 4,069,075, the active thermal protective material in accordance with the present invention is not applied to the substrate but is instead spaced from it by the mesh 205.

Figure 7:
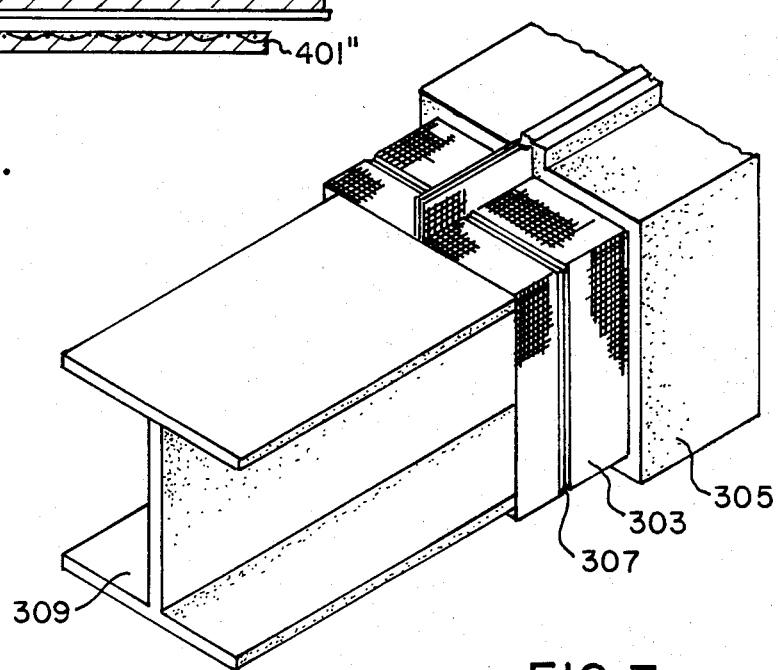
FIG. 7 is a view in perspective, partially broken away, of another embodiment of a thermal protective envelope system of the present invention, applied to an I-beam or column.

As shown in FIG. 7, the system may also be utilized to protect a structural element such as an I-beam or column. In this embodiment, the mesh support structure is an expanded metal mesh 303. It may be noted that as best shown in this FIGURE, bending flanges outwardly tends to flatten the ridges 307 somewhat as they cross the flanges, and when the flanges of the mesh 303 are held together, the ridges 307 are compressed nearly flat. This phenomenon is observed in all embodiments in which the ridges extend across the bends in the mesh support structure.

Figure 8:
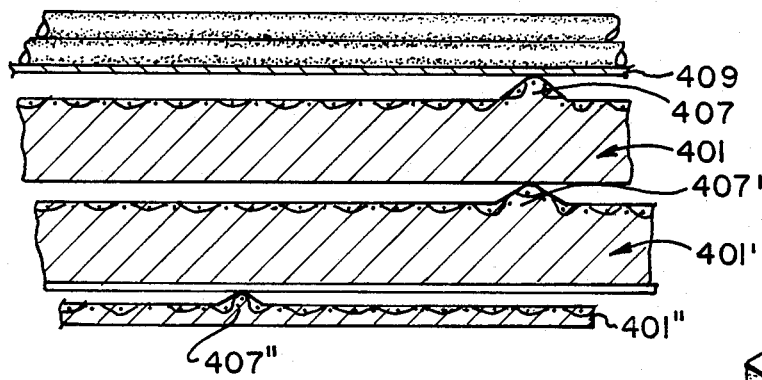
FIG. 8 is a fragmentary sectional view of another embodiment of a thermal protective envelope system of the present invention.

In the embodiment shown in FIG. 8, a cable tray is given multiple hour protection by surrounding it with multiple layers of the envelope system of FIGS. 1-3. It will be seen that the inner envelope 401 is spaced from the tray 409 by ridges 407, the next outer envelope 401' is spaced from the inner envelope by its ridges 407' and that the outer envelope 401" is likewise spaced from the envelope 401' by its ridges 407". The outer envelope 401" is provided with only a thin coating of active thermal protective material 405" and acts primarily to assure the integrity of the active thermal protective material of the inner envelopes 401 and 401'.

Figure 9:
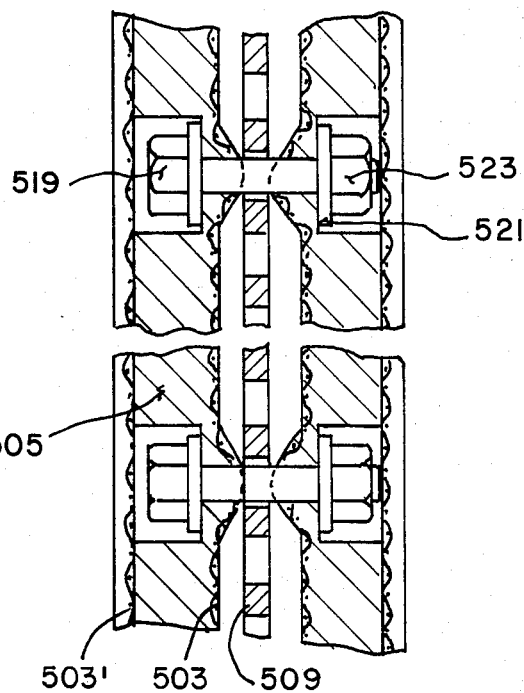
FIG. 9 is a fragmentary sectional view of a fire wall formed in accordance with a fire protective system of the present invention.

In FIG. 9, a fire wall is formed by sandwiching a sheet of heavy expanded metal 509 between two pairs of screen 503 and 503' coated with an active thermal protective composition 505, in accordance with the first embodiment of the present invention. The four assemblies are held together by bolts 519, washers 521, and nuts 523. The bolts 519 preferably extend through the ridges 507, to maintain the air gap between the screens 503 and 503'. It will be seen that in this system, unlike the envelope systems previously described, the sections of screen 503 and 503' are mounted directly to the substrate, rather than being held frictionally to the substrate.

Figure 10:
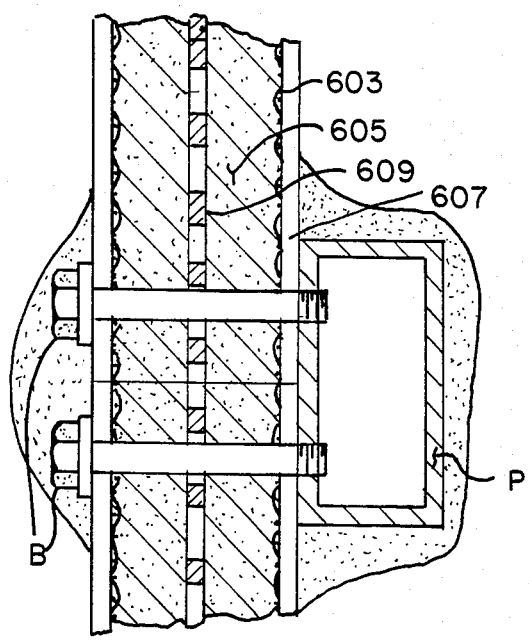
FIG. 10 is a fragmentary sectional view of another embodiment of a fire wall formed in accordance with a fire protective system of the present invention.

The fire wall system in accordance with the embodiment of FIG. 9 may be modified in numerous ways. For example, as shown in FIG. 10, an active thermal protective composition 605 may be sprayed directly onto both faces of a sheet 609 of expanded metal. The composition 605 is preferably the same as utilized in the embodiment of FIGS. 1–3. While the active thermal protective material 605 is still tacky, screen 603 is rolled into it, with integral stiffening ridges 607 to the outside. The screen 603 is preferably the same as utilized in the embodiment of FIGS. 1–3. This arrangement lacks substantial air space between the composition 605 and the expanded metal 609, although the spaces in the mesh may supply some air space. It is therefore less efficient than the embodiment shown in FIG. 9. It will also be seen that in this embodiment the screen 603 functions largely to prevent the char from separating under fire conditions, and the ridges 607 perform primarily merely a stiffening function. Despite these limitations, this embodiment does provide a fire wall having remarkable resistance to flame and thermal extremes and does provide a very simple, light and rigid fire wall. Individual panels of the fire wall may be joined to a post or other structural element P by bolts B, to provide a continuous fire wall system.

Figure 11:
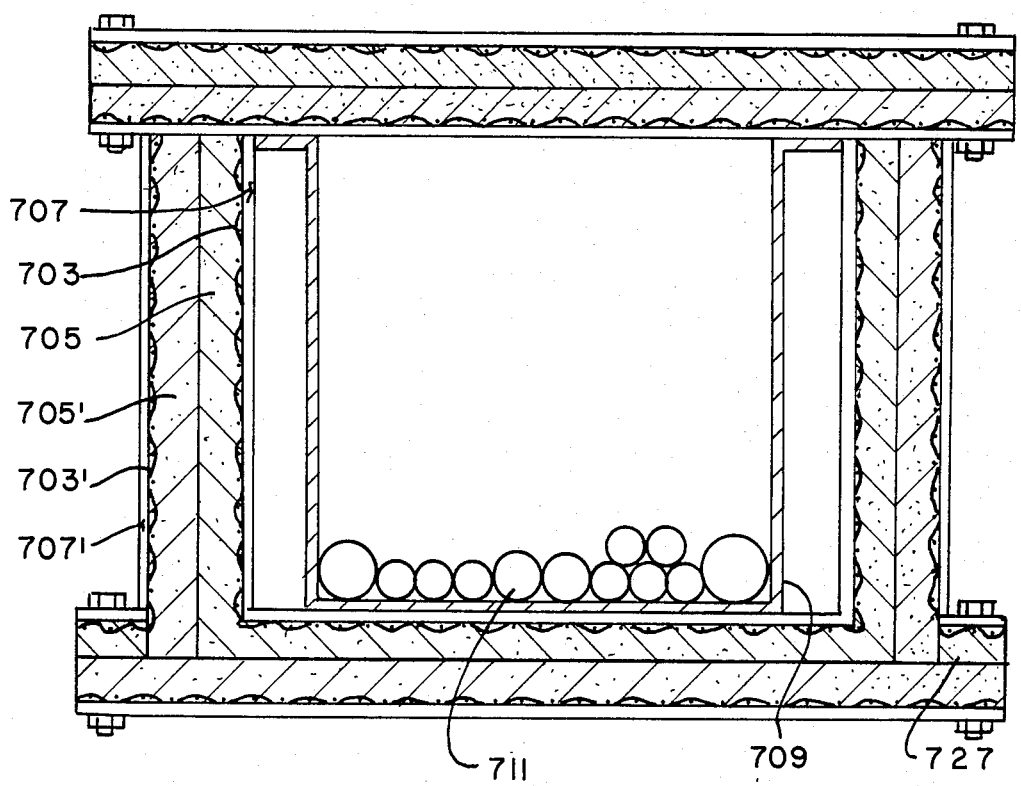
FIG. 11 is a fragmentary sectional view of another embodiment of a thermal protective envelope system of the present invention.

As shown in FIG. 11, the outer layer of a thermal protective envelope system of the present invention may be installed around a cable tray or other structure with the mesh of the outer layer of the assembly facing outward. In this embodiment, first and second envelope assemblies are applied around a cable tray 709. The first envelope assembly is identical with the embodiment of FIGS. 1–3 and comprises an active thermal protective material 705 and a screen 703 having ridges 707 spacing the assembly from the cable tray 709 carrying cables 711. The second assembly is preformed and is applied over the first envelope. The second assembly comprises a layer of active thermal protective material 705′ in contact with the first layer 705, and a screen 703′ at the outside of the second assembly. This arrangement provides only a single dead air space, between the cable tray and the envelope system, but the system has the advantage that the outer screen 703′ functions to hold the char together when the system is subjected to fire or other thermal extreme, without requiring a third assembly as in the embodiment of FIG. 8.

Figure 12:
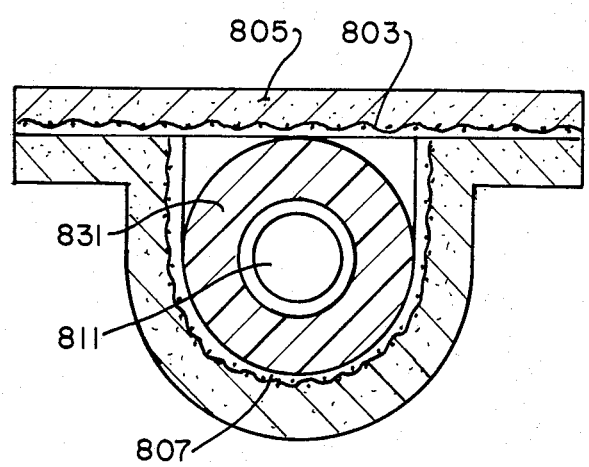
FIG. 12 is a view in cross section of another embodiment of the present invention, applied to a cable drop.

Particularly as applied to cable trays, the embodiments of the present invention previously described have the advantage over many prior systems that the protective coating is not as thick. Therefore, the present system permits substantial thermal conductivity during day-to-day operation and does not cause as significant a de-rating of the electrical cables it is protecting as is caused, for example, by blankets of inorganic material. Although this is a significant advantage of the present system, there are occassions in which a ceramic blanket may be used with the present envelope system. As shown in FIG. 12, for example, a single cable 811 may extend outside of a cable tray in a so-called "air drop". Such a cable may easily be protected by wrapping it in a ceramic blanket 831, and then applying a protective envelope including a screen 803 spaced from the ceramic blanket 831 by stiffening ridges 807 integral with the screen and coated with an active thermal protective material 805. The protective envelope may be formed of the same screen and composition utilized in the embodiment illustrated in FIGS. 1–3.

Numerous variations in the system and methods of the present invention, within the scope of the appended claims will occur to those skilled in the art in light of the foregoing disclosure. For example, the flexibility of the screen 3 enables it to be bent to many desired shapes. The system is therefore easily adapted to protection of cylindrical and other shaped substrates. Other integral spacers than ridges may be utilized in the mesh support structure, although ridges are preferred for a number reasons such as their providing stiffening of the system and helping to interlock the thermal protective material to the mesh support structure. These variations are merely illustrative.

I claim:

1. A thermal protective structure applied over a substrate, the thermal protective structure comprising a mesh support structure having a plurality of spacers formed integrally therein and an active thermal protective material applied to the support structure, the active thermal protective material forming a continuous layer which is held, through the major part of its extent, spaced from the substrate by the spacers and responding to thermal extremes to protect the substrate.

2. The structure of claim 1 wherein the mesh support structure is a conformable, self-stiffened metal mesh, wherein said integrally formed spacers comprise V-shaped stiffening ridges, and wherein said protective material has a thickness which is greater above said spacers than between said spacers.

3. The structure of claim 2 wherein the V-shaped stiffening ridges have a height of 0.1 to 1.0 inches and a base of about 0.1 to about 1.0 inches.

4. The structure of claim 3 wherein the V-shaped stiffening ridges are spaced apart about two to eighteen inches.

5. The structure of claim 4 wherein the V-shaped stiffening ridges have a height of 0.35+/−0.15 inches.

6. The structure of claim 3 wherein the mesh is a woven steel screen having on the order of four to twelve openings per linear inch.

7. The structure of claim 2 wherein said substrate is an elongate structure and wherein said ridges run transverse to the elongate structure.

8. The structure of claim 1 wherein the active thermal protective material includes a component which when subjected to thermal extremes undergoes an endothermic phase change from a solid to a vapor.

9. The structure of claim 8 wherein the active thermal protective material expands when subjected to thermal extremes to form a continuous porosity matrix.

10. The structure of claim 1 wherein the active thermal protective material expands when subjected to thermal extremes.

11. The structure of claim 1 wherein the mesh is applied around the substrate as an envelope.

12. A thermal protective structure for application over a substrate, the thermal protective structure comprising a conformable, self-stiffened metal mesh having spacers formed integrally therein, said spacers comprising stiffening ridges having a height of 0.1 to 1.0 inches and a base of about 0.1 to about 1.0 inches and being spaced apart about two to eighteen inches, and an active thermal protective material applied in a continuous layer to one side of the metal mesh, the other side of the metal mesh being at least partially exposed, whereby the metal mesh acts as a base for the active material but is not encapsulated by it.

13. The structure of claim 12 wherein the structure comprises a plurality of pieces of said mesh connected directly to each other to form an elongate envelope, with said ridges directed toward the inside of said envelope.

14. The structure of claim 13 wherein the active thermal protective material includes a component which when subjected to thermal extremes undergoes an endothermic phase change from a solid to a vapor.

15. The structure of claim 13 wherein the thermal protective material expands when subjected to thermal extremes to form a continuous porosity matrix.

16. The structure of claim 13 wherein said stiffening ridges have a height from 0.2 to 0.5 inches.

17. In combination, a metal cable tray containing a plurality of electrical cables extending in a first direction, and a thermal protective structure applied as an envelope around the cable tray, the thermal protective structure comprising a mesh support structure having a plurality of spacers formed integrally therein, said spacers comprising stiffening ridges, said integral spacers extending transverse to said first direction, and an active thermal protective material applied in a continuous layer to the support structure, the active thermal protective material being held, through the major part of its extent, spaced from the cable tray by the integral spacers and responding to thermal extremes to protect the cable tray.

18. The structure of claim 17 wherein the active thermal protective material includes a component which when subjected to thermal extremes undergoes an endothermic phase change from a solid to a vapor.

19. The structure of claim 17 wherein the thermal protective material expands when subjected to thermal extremes to form a continuous porosity matrix.

20. The structure of claim 17 wherein the ridges have a height of about 0.1 to 1.0 inches and a base of about 0.1 to about 1.0 inches and are spaced apart about two to eighteen inches.

* * * * *